US012583385B2

(12) United States Patent
Nojiri et al.

(10) Patent No.: US 12,583,385 B2
(45) Date of Patent: Mar. 24, 2026

(54) AWAKENING SUPPORT SYSTEM, AWAKENING SUPPORT METHOD, AND RECORDING MEDIUM

(71) Applicant: HONDA MOTOR CO., LTD., Tokyo (JP)

(72) Inventors: Tsuyoshi Nojiri, Wako (JP); Ryo Kimura, Wako (JP); Nobuko Minyu, Wako (JP); Hiroko Adachi, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 70 days.

(21) Appl. No.: 18/641,561

(22) Filed: Apr. 22, 2024

(65) Prior Publication Data

US 2024/0359623 A1     Oct. 31, 2024

(30) Foreign Application Priority Data

Apr. 25, 2023     (JP) ................................. 2023-071752

(51) Int. Cl.
| | |
|---|---|
| *B60Q 9/00* | (2006.01) |
| *B60H 1/00* | (2006.01) |
| *G06F 3/16* | (2006.01) |
| *G10L 25/78* | (2013.01) |
| *H03G 3/30* | (2006.01) |
| *H04R 3/04* | (2006.01) |

(52) U.S. Cl.
CPC ........... *B60Q 9/00* (2013.01); *B60H 1/00757* (2013.01); *G06F 3/165* (2013.01); *G10L 25/78* (2013.01); *H04R 3/04* (2013.01); *H03G 3/3005* (2013.01); *H04R 2430/01* (2013.01); *H04R 2499/13* (2013.01)

(58) Field of Classification Search
CPC ....... B60Q 9/00; B60H 1/00757; G06F 3/165; G10L 25/78; H04R 3/04; H04R 2430/01; H04R 2499/13; H03G 3/3005
See application file for complete search history.

(56) References Cited

U.S. PATENT DOCUMENTS

| | | | | |
|---|---|---|---|---|
| 12,065,160 B2 * | 8/2024 | Ishibashi | ............... | B60W 40/08 |
| 2022/0332246 A1 * | 10/2022 | Takeuchi | .............. | B60W 50/16 |

FOREIGN PATENT DOCUMENTS

| | | | | |
|---|---|---|---|---|
| EP | 3203468 B1 * | 9/2023 | ............. | G06F 3/165 |
| JP | 2009-208739 A | 9/2009 | | |
| JP | 2018206198 A * | 12/2018 | ........... | B60W 40/08 |
| JP | 2019215640 A * | 12/2019 | | |

(Continued)

*Primary Examiner* — David L Ton
(74) *Attorney, Agent, or Firm* — Rankin, Hill & Clark LLP

(57) ABSTRACT

An awakening support system includes: a lyric presence determination unit configured to determine whether lyrics are contained in a target reproduction sound that is being output from an audio device in a mobile body; and an awakening effect control unit configured to, when it is determined by the lyric presence determination unit that lyrics are contained in the target reproduction sound, execute at least one selected from: first bass amplification processing that amplifies and outputs a prescribed bass part of the target reproduction sound from the audio device; cool air sending processing that sends out cool air from an air conditioning device provided in the mobile body; and illuminance increasing processing that increases illuminance of a lighting device provided in the mobile body.

8 Claims, 4 Drawing Sheets

(56)          References Cited

FOREIGN PATENT DOCUMENTS

| JP | 2020082906 | A | * | 6/2020 | | |
|----|------------|---|---|--------|--------|-----------|
| JP | 2023017603 | A | * | 2/2023 | | |
| WO | WO-2018163497 | A1 | * | 9/2018 | ............ | A61M 21/00 |
| WO | WO-2018163532 | A1 | * | 9/2018 | ............ | B60K 28/06 |
| WO | WO-2023171193 | A1 | * | 9/2023 | ............... | G08G 1/16 |

* cited by examiner

AWAKENING SUPPORT SYSTEM, AWAKENING SUPPORT METHOD, AND RECORDING MEDIUM

INCORPORATION BY REFERENCE

The present application claims priority under 35 U.S.C. § 119 to Japanese Patent Application No. 2023-071752 filed on Apr. 25, 2023. The content of the application is incorporated herein by reference in its entirety.

BACKGROUND OF THE INVENTION

Field of the Invention

The present invention relates to an awakening support system, an awakening support method, and a recording medium.

Description of the Related Art

Recently, there have been active efforts being made to provide an access to sustainable transport systems considering those who are vulnerable among traffic participants. In order to achieve it, research and development for further improving the traffic safety and convenience are being conducted concentratedly through research and development related to preventive safety technologies. For example, Japanese Patent Laid-Open No. 2009-208739 discloses an anti-drowsiness device that plays awakening music when it is determined that a driver is feeling drowsy by: processing that detects drowsiness based on an image of a face part of the driver captured by a first in-vehicle camera 11; and second drowsiness detection processing that detects drowsiness of the driver based on a white line on a road captured by a second in-vehicle camera 12.

By the way, in the preventive safety technologies, it is effective to have the driver of a mobile body listen to reproduction sound such as music, lecture, or the like for preventing drowsiness. However, the awakening effect for the driver varies depending on the contents of the reproduction sound the driver is listening to. It is therefore an object of the present invention to improve the awakening effect for the driver achieved by outputting reproduction sound in a mobile body.

In order to overcome the foregoing issue, the present application is designed to improve the awakening effect for the driver achieved by outputting reproduction sound in a mobile body. This consequently contributes to developing a sustainable transport system.

SUMMARY OF THE INVENTION

A first aspect for achieving the foregoing object is an awakening support system that includes: a lyric presence determination unit configured to determine whether lyrics are contained in a target reproduction sound that is being output from an audio device in a mobile body; and an awakening effect control unit configured to, when it is determined by the lyric presence determination unit that lyrics are contained in the target reproduction sound, execute at least one selected from: first bass amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device used in the mobile body.

The awakening support system may include a first reproduction sound determination unit configured to determine whether a first reproduction sound determination condition is satisfied, the first reproduction sound determination condition being that a part where a sound pressure repeatedly increases/decreases by a first prescribed level or more is contained in the target reproduction sound and that a changing rate of a period where the increase/decrease is repeated is equal to or less than a prescribed changing rate, in which the lyric presence determination unit determines whether lyrics are contained in the target reproduction sound, when it is determined by the first reproduction sound determination unit that the first reproduction sound determination condition is satisfied.

The awakening support system may include a vocal adding control unit configured to execute vocal adding processing that outputs, from the audio device, vocal added music acquired by adding a human vocal part to the target reproduction sound, when it is determined by the lyric presence determination unit that lyrics are not contained in the target reproduction sound, in which, when the vocal added music is being output from the audio device, the awakening effect control unit executes at least one selected from: second bass amplification processing that amplifies and outputs, from the audio device, a prescribed bass part of the vocal added music; the cool air sending processing; and the illuminance increasing processing.

In the awakening support system, the awakening effect control unit may set an amplification degree of the bass part in the second bass amplification processing to be larger than an amplification degree of the bass part in the first bass amplification processing.

The awakening support system may include: a first reproduction sound determination unit configured to determine whether a first reproduction sound determination condition is satisfied, the first reproduction sound determination condition being that a part where a sound pressure repeatedly increases/decreases by a first prescribed level or more is contained in the target reproduction sound and that a changing rate of a period where the increase/decrease is repeated is equal to or less than a prescribed changing rate; a second reproduction sound determination unit configured to determine whether a second reproduction sound determination condition is satisfied, the second reproduction sound determination condition being that: it is determined by the first reproduction sound determination unit that the first reproduction sound determination condition is not satisfied; and that a period where an increase/decrease degree of a sound pressure is equal to or less than a second prescribed level repeatedly appears in the target reproduction sound; a human voice presence determination unit configured to determine whether a human voice presence determination condition is satisfied when it is determined by the second reproduction sound determination unit that the second reproduction sound determination condition is satisfied, the human voice presence determination condition being that a sound in a first prescribed frequency band assumed to be a male voice or a sound in a second prescribed frequency band assumed to be a female voice is contained in the target reproduction sound, in which, when it is determined by the human voice presence determination unit that the human voice presence determination condition is not satisfied, the awakening effect control unit executes at least one selected from: third bass amplification processing that amplifies a prescribed bass part of the target reproduction sound by an amplification degree that is set to be larger than an amplification degree for the bass part in the first bass amplification processing, when the target reproduction sound is being output from the audio device; the cool air sending processing; and the illuminance increasing processing.

The awakening support system may include a singing voice determination unit configured to determine whether the sound in the first prescribed frequency band assumed to be the male voice or the sound in the second prescribed frequency band assumed to be the female voice is a singing voice of a person, when it is determined by the human voice presence determination unit that the human voice presence determination condition is satisfied, in which, when it is determined by the singing voice determination unit that the sound in the first prescribed frequency band assumed to be the male voice or the sound in the second prescribed frequency band assumed to be the female voice is not a singing voice of a person, the awakening effect control unit executes output reproduction sound switching processing that switches a reproduction sound output from the audio device from the target reproduction sound to prescribed awakening music.

A second aspect for achieving the foregoing object is an awakening support method executed by a computer, and the awakening support method includes: a lyric presence determination step of determining whether lyrics are contained in a target reproduction sound that is being output from an audio device in a mobile body; and an awakening effect control step of, when it is determined by the lyric presence determination step that lyrics are contained in the target reproduction sound, executing at least one selected from: first bass amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device provided in the mobile body.

A third aspect for achieving the foregoing object is a non-transitory recording medium storing a program that causes a computer to function as: a lyric presence determination unit configured to determine whether lyrics are contained in a target reproduction sound that is being output from an audio device in a mobile body; and an awakening effect control unit configured to, when it is determined by the lyric presence determination unit that lyrics are contained in the target reproduction sound, execute at least one selected from: first bass amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device provided in the mobile body.

According to the awakening support system, the awakening support method, and the program, it is possible to improve the awakening effect for the driver achieved by outputting music in the mobile body.

DETAILED DESCRIPTION OF THE PREFERRED EMBODIMENTS

1. Configuration of Awakening Support System

Figure 1:
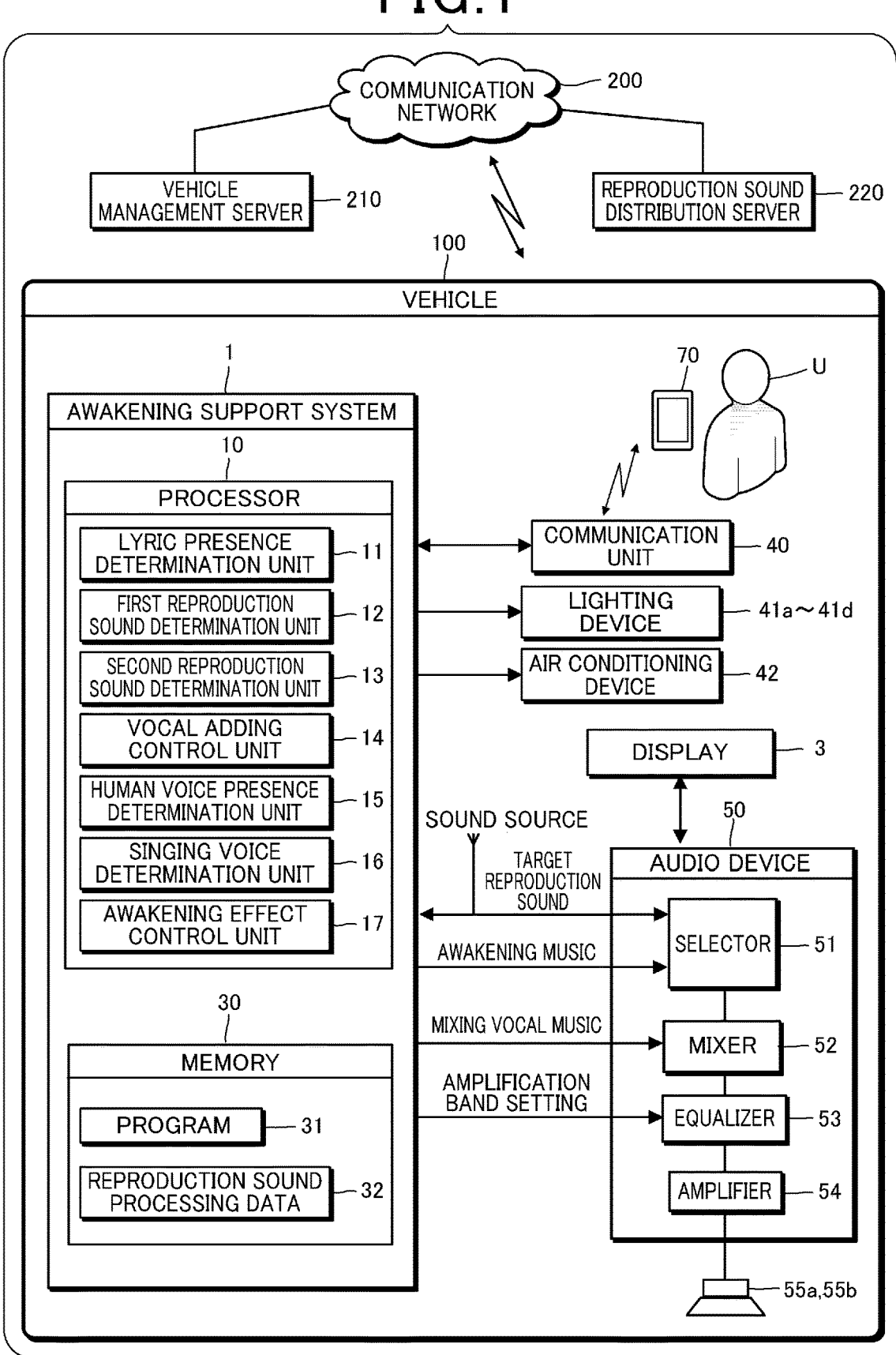
FIG. 1 is a block diagram of an awakening support system.

The configuration of an awakening support system 1 according to the present disclosure will be described with reference to FIG. 1 and FIG. 2. Referring to FIG. 1, the awakening support system 1 is loaded on a vehicle 100, and connected to a communication unit 40, a lighting device 41 (41a to 41d), an air conditioning device 42, and an audio device 50 provided in the vehicle 100. The vehicle 100 corresponds to a mobile body of the present disclosure.

The communication unit 40 performs communication with servers outside the vehicle 100, such as a vehicle management server 210 and a reproduction sound distribution server 220 via a communication network 200. Furthermore, the communication unit 40 performs communication with a communication terminal 70 used by a driver U riding in the vehicle 100. The communication terminal 70 may be a smartphone, a mobile phone, a tablet terminal, or the like. The lighting device 41, as shown in FIG. 2, is provided in the interior of the vehicle 100 and emits light in the interior.

Figure 2:
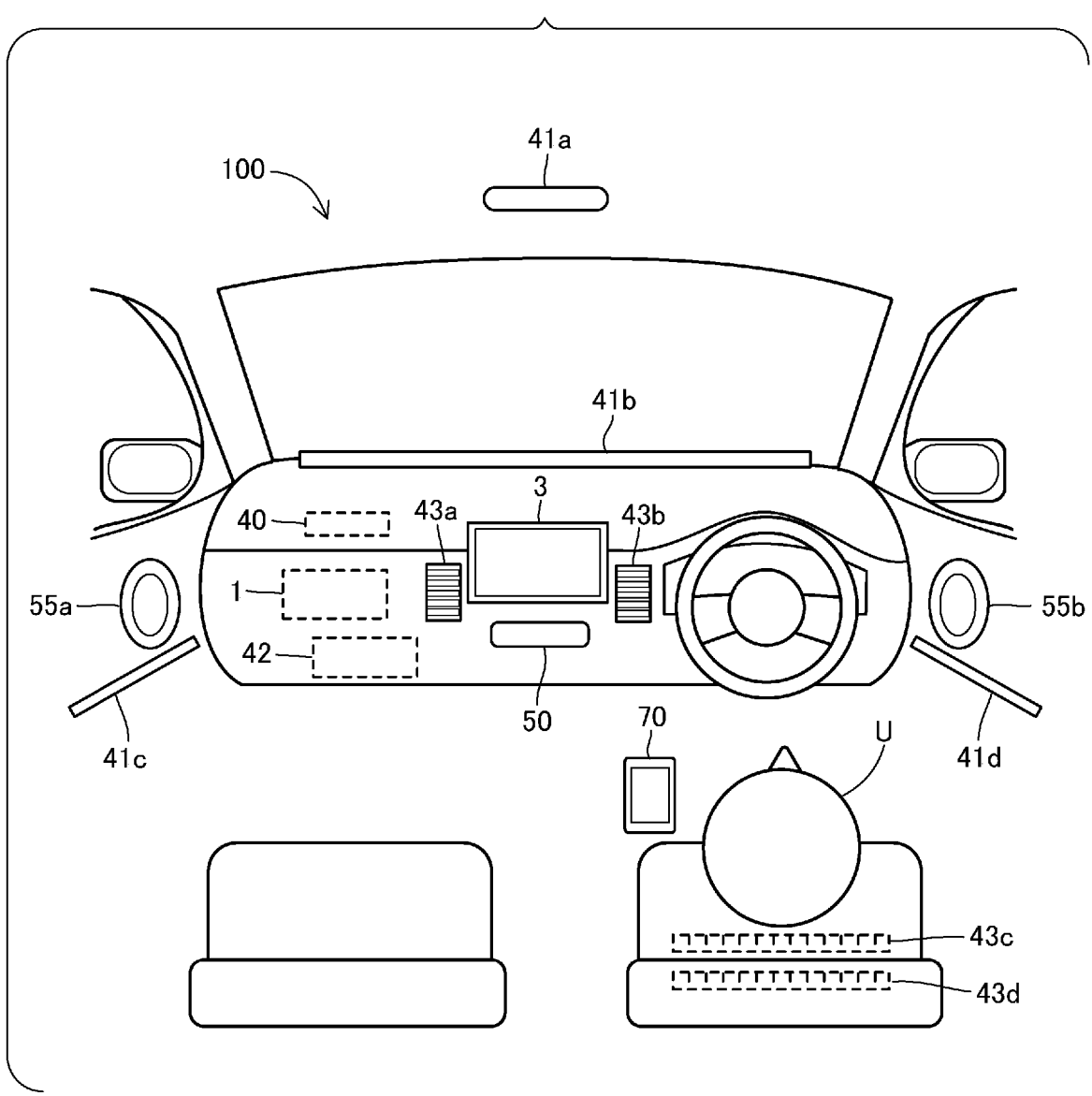
FIG. 2 is a block diagram of a vehicle in the vicinity of a driver's seat.

While the lighting device 41a disposed on the ceiling, the lighting device 41b disposed on the dashboard, and the lighting devices 41c, 41d disposed at the doors are illustrated in FIG. 2 as the lighting device 41, the lighting device 41 may also be disposed at other sections in the interior. The air conditioning device 42 sends out cool air or warm air from air outlets 43a, 43b (see FIG. 2) to air-condition the interior of the vehicle 100. Furthermore, the air conditioning device 42 may send out cool air or warm air from an air outlet 43c disposed on the seat face of the driver's seat or an air outlet 43d disposed on the back face of the driver's seat (air ventilation, seat air sending function). An air conditioning device for air ventilation may also be provided separately from the air conditioning device 42.

An audio device 50 reproduces data of reproduction sound (target reproduction sound) supplied from a sound source or data of awakening music output from the awakening support system 1, and outputs it from speakers 55a and 55b. While the speakers 55a and 55b disposed at the doors of the vehicle 100 are illustrated in FIG. 2, the speakers may also be disposed at other sections of the vehicle 100. The sound source is the reproduction sound distribution server 220, a recording medium on which data of the reproduction sound is recorded, or the like. The reproduction sound reproduced by the audio device 50 is selected by operations or the like of a display 3 (touch panel) made by the driver U of the vehicle 100. Furthermore, by having the communication terminal 70 as the sound source, the audio device 50 may receive and acquire the data of reproduction sound saved in a memory of the communication terminal 70. Alternatively, the audio device 50 may receive and acquire the data of reproduction sound transmitted from the reproduction sound distribution server 220 via the communication terminal 70.

The audio device 50 includes: a selector 51 that selects any of the target reproduction sound and the awakening music as the reproduction target; a mixer 52 that adds (mixes) mixing vocal music output from the awakening support system 1 to the music selected by the selector 51; an equalizer 53 that amplifies or attenuates components of a prescribed frequency band of the music output from the mixer 52; and an amplifier 54 that amplifies and outputs, from the speakers 55*a*, 55*b*, music signals output from the equalizer 53. Note that the awakening support system 1 may be configured to have the function of the selector 51.

The awakening support system 1 is a control unit that includes a processor 10, a memory 30, and the like. The processor 10 corresponds to a computer of the present disclosure. The memory 30 saves a program 31 for controlling the awakening support system 1, and reproduction sound processing data 32 including the data of the awakening music and mixing voice described above, and the like. The program 31 may be read out from a recording medium (magnetic disk, optical disk, flash memory, or the like) and saved in the memory 30, or may be downloaded from the vehicle management server 210 or the like and saved in the memory 30.

By reading out and executing the program 31, the processor 10 functions as a lyric presence determination unit 11, a first reproduction sound determination unit 12, a second reproduction sound determination unit 13, a vocal adding control unit 14, a human voice presence determination unit 15, a singing voice determination unit 16, and an awakening effect control unit 17. Processing executed by the lyric presence determination unit 11 corresponds to a lyric presence determination step of the awakening support method according to the present disclosure, and processing executed by the awakening effect control unit 17 corresponds to an awakening effect control step of the awakening support method according to the present disclosure.

The lyric presence determination unit 11 determines whether the target reproduction sound contains lyrics by analyzing, by AI (Artificial Intelligence) algorithm, for example, output information in a prescribed sampling period (for example, 10 minutes or more) regarding the target reproduction sound that is supplied from the music source, reproduced by the audio device 50, and output from the speakers 55*a*, 55*b*. Note that the reproduction sound information indicating the contents of the target reproduction sound may be acquired from the reproduction sound distribution server 220 to determine whether lyrics are contained in the target reproduction sound.

The first reproduction sound determination unit 12 measures changes in the sound pressure in the prescribed sampling period of the target reproduction sound output from the audio device 50 to determine whether the following first reproduction sound determination condition is satisfied for the target reproduction sound. Note that whether the following first reproduction sound determination condition is satisfied for the target reproduction sound may be determined by receiving and acquiring information regarding fluctuation in the sound pressure of the target reproduction sound from the reproduction sound distribution server 220.

First reproduction sound determination condition: Part where the sound pressure repeatedly increases/decreases for a first prescribed level or more is contained in the target reproduction sound, and a changing rate of the period at which the increase/decrease is repeated is equal to or less than a prescribed changing rate.

The second reproduction sound determination unit 13 measures changes in the sound pressure in the prescribed sampling period of the target reproduction sound output from the audio device 50 to determine whether the following second reproduction sound determination condition is satisfied for the target reproduction sound. Note that whether the following second reproduction sound determination condition is satisfied for the target reproduction sound may be determined by receiving and acquiring information regarding fluctuation in the sound pressure of the target reproduction sound from the reproduction sound distribution server 220 or the like.

Second reproduction sound determination condition: The first reproduction sound determination condition is not satisfied, and a period where the increase/decrease degree of the sound pressure is equal to or less than a second prescribed level appears repeatedly in the target reproduction sound.

When it is determined by the lyric presence determination unit 11 that lyrics are not contained in the target reproduction sound, the vocal adding control unit 14 outputs the data of the mixing vocal music saved in the music processing data to the audio device 50 to execute vocal adding processing for outputting vocal added music acquired by adding a vocal part to the target reproduction sound from the audio device 50. In the audio device 50, the vocal added music acquired by adding a vocal part to the target reproduction sound is generated by the mixer 52, and the vocal added music is output from the speakers 55*a*, 55*b*. The vocal music is, for example, music playing a melody by voice such as "Ah~" or the like.

When it is determined by the second reproduction sound determination unit 13 that the second reproduction sound determination condition is not satisfied, the human voice presence determination unit 15 performs a frequency analysis targeted in the prescribed sampling period of the target reproduction sound output from the audio device 50 to determine whether the following human voice presence determination condition is satisfied based on the result of the frequency analysis.

Human voice presence determination condition: Target reproduction sound contains a sound in the first prescribed frequency band (for example, 150 to 170 Hz) assumed to be male voice, or a sound in the second prescribed frequency band (for example, 180 to 270 Hz) assumed to be female voice.

When it is determined by the human voice presence determination unit 15 that the human voice presence determination condition is satisfied, the singing voice determination unit 16 determines whether the voice contained in the target reproduction sound is a singing voice of a person by recognizing whether the peak changes in the first frequency band or the second frequency band.

In the following cases 1 to 5, the awakening effect control unit 17 executes the following processing for improving the awakening effect for the driver U.

Case 1: When it is determined by the first reproduction sound determination unit 12 that the first reproduction sound determination condition is satisfied, and it is determined by the lyric presence determination unit 11 that lyrics are contained in the target reproduction sound. The case 1 is a case assumed to have a very high awakening effect, in which the target reproduction sound is Pops, Jazz, or the like.

In the case 1, the awakening effect control unit 17 executes the following first processing to third processing. Note that not all of the first processing to the third processing but at least one of those may be executed.

First processing: A control signal for amplifying a prescribed bass part (for example, part in a frequency band of 100 Hz or lower) of the target reproduction sound is output to the audio device 50. The audio device 50 upon receiving the control signal amplifies the bass part by the equalizer 53 (corresponds to first bass amplification processing of the present disclosure).

Second processing: The air conditioning device 42 sends out cool air from the air outlets 43*a* and 43*b*.

Third processing: Illuminance of the lighting device 41 is increased. Increasing the illuminance includes turning on the lighting device 41 that is in an off state.

Case 2: When it is determined by the lyric presence determination unit 11 that lyrics are not contained in the target reproduction sound, and the vocal adding processing is executed by the vocal adding control unit 14. The case 2 is a case assumed to have a relatively high awakening effect of the target reproduction sound.

In the case 2, the awakening effect control unit 17 executes the first processing to the third processing. Note that not all of the first processing to the third processing but at least one of those may be executed. In the case 2, the awakening effect control unit 17 sets the amplification degree of the bass part in the first processing to be greater than that of the case 1 (corresponds to second bass amplification processing of the present disclosure).

Case 3: When it is determined by the second reproduction sound determination unit 13 that the second reproduction sound determination condition is satisfied, and it is determined by the human voice presence determination unit 15 that the human voice presence determination condition is satisfied. The case 3 is a case assumed to have a low awakening effect, in which the target reproduction sound is music of a musical or the like.

In the case 3, the awakening effect control unit 17 executes the first processing to the third processing. Note that not all of the first processing to the third processing but at least one of those may be executed. In the case 3, the awakening effect control unit 17 sets the amplification degree of the bass part in the first processing to be greater than that of the case 1.

Case 4: When it is determined by the second reproduction sound determination unit 13 that the second reproduction sound determination condition is satisfied, determined by the human voice presence determination unit 15 that the human voice presence determination condition is satisfied, and determined by the singing voice determination unit 16 that the voice contained in the target reproduction sound is not singing voice of a person. The case 4 is a case assumed to have no awakening effect, in which the target reproduction sound is mainly configured with talks.

In the case 4, the awakening effect control unit 17 executes the following fourth processing as well as the second processing and the third processing described above. Note that not all of the fourth processing, the second processing, and the third processing but at least one of those may be executed.

Fourth processing: Data of the awakening music contained in the reproduction sound processing data 32 is output to the audio device 50. The audio device 50 switches, by the selector 51, the music to be reproduced from the target reproduction sound to the awakening music. Selection of the awakening music is performed, for example, by having a test passenger listen to the music and measuring changes in the heart rate, and extracting the music with many sections where the heart rate changes more than a threshold.

Case 5: When it is determined by the second reproduction sound determination unit 13 that the second reproduction sound determination condition is satisfied, and it is determined by the human voice presence determination unit 15 that the human voice presence determination condition is not satisfied. The case 5 is a case assumed to have a low awakening effect, in which the target reproduction sound is classical music or the like.

In the case 5, the awakening effect control unit 17 executes the first processing to the third processing. Note that not all of the first processing to the third processing but at least one of those may be executed. In the case 5, the awakening effect control unit 17 sets the amplification degree of the bass part in the first processing to be greater than that of the case 1 (corresponds to third bass amplification processing of the present disclosure).

2. Awakening Support Processing

The procedure of the awakening support processing executed by the awakening support system 1 will be described according to the flowcharts shown in FIG. 3 to FIG. 4. The awakening support system 1 repeatedly executes the awakening support processing through the flowcharts of FIG. 3 to FIG. 4 to support awakening of the driver U, when the vehicle 100 is in a power-on state.

Figure 3:
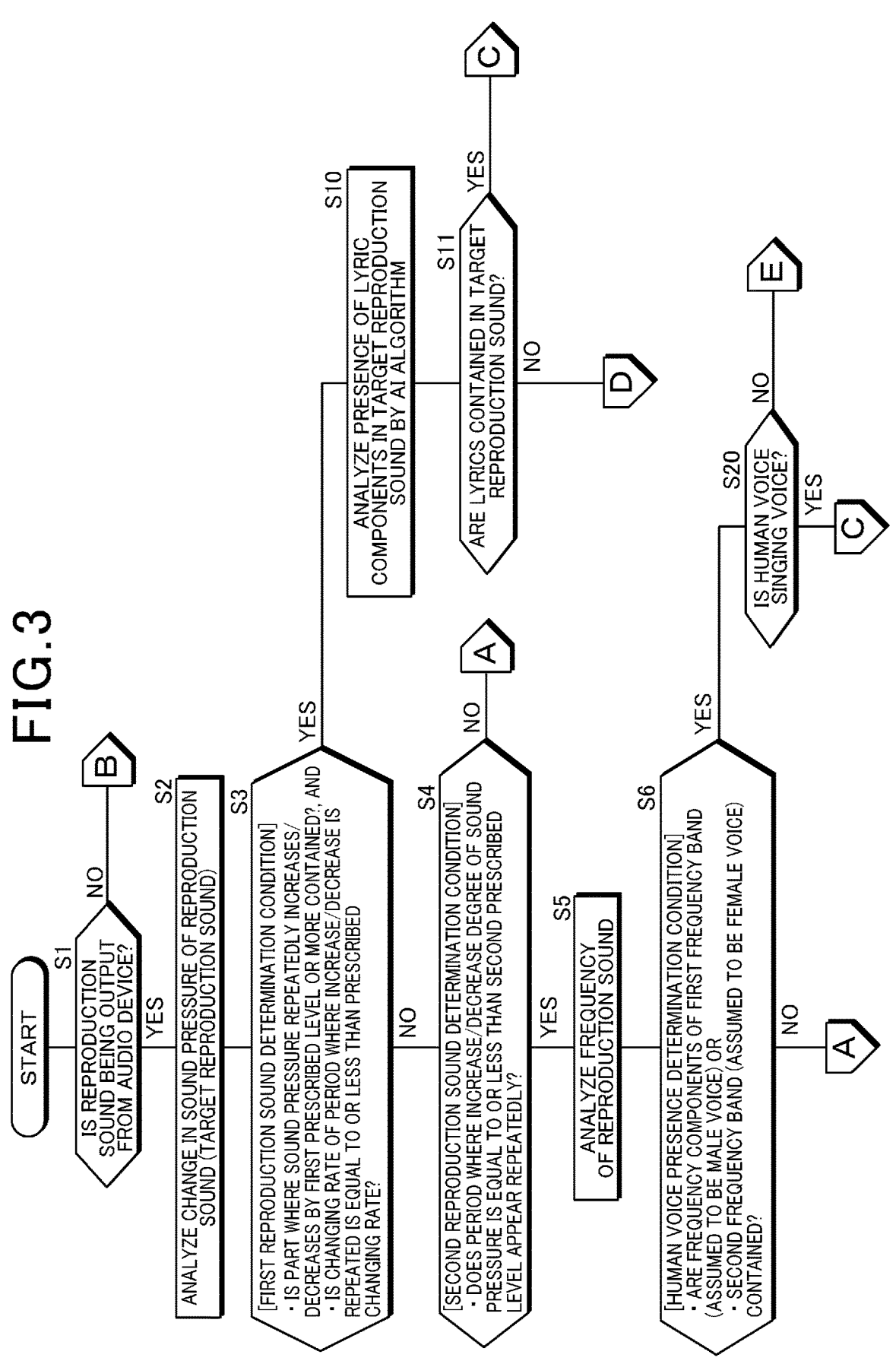
FIG. 3 is a first flowchart of awakening support processing.
Figure 4:
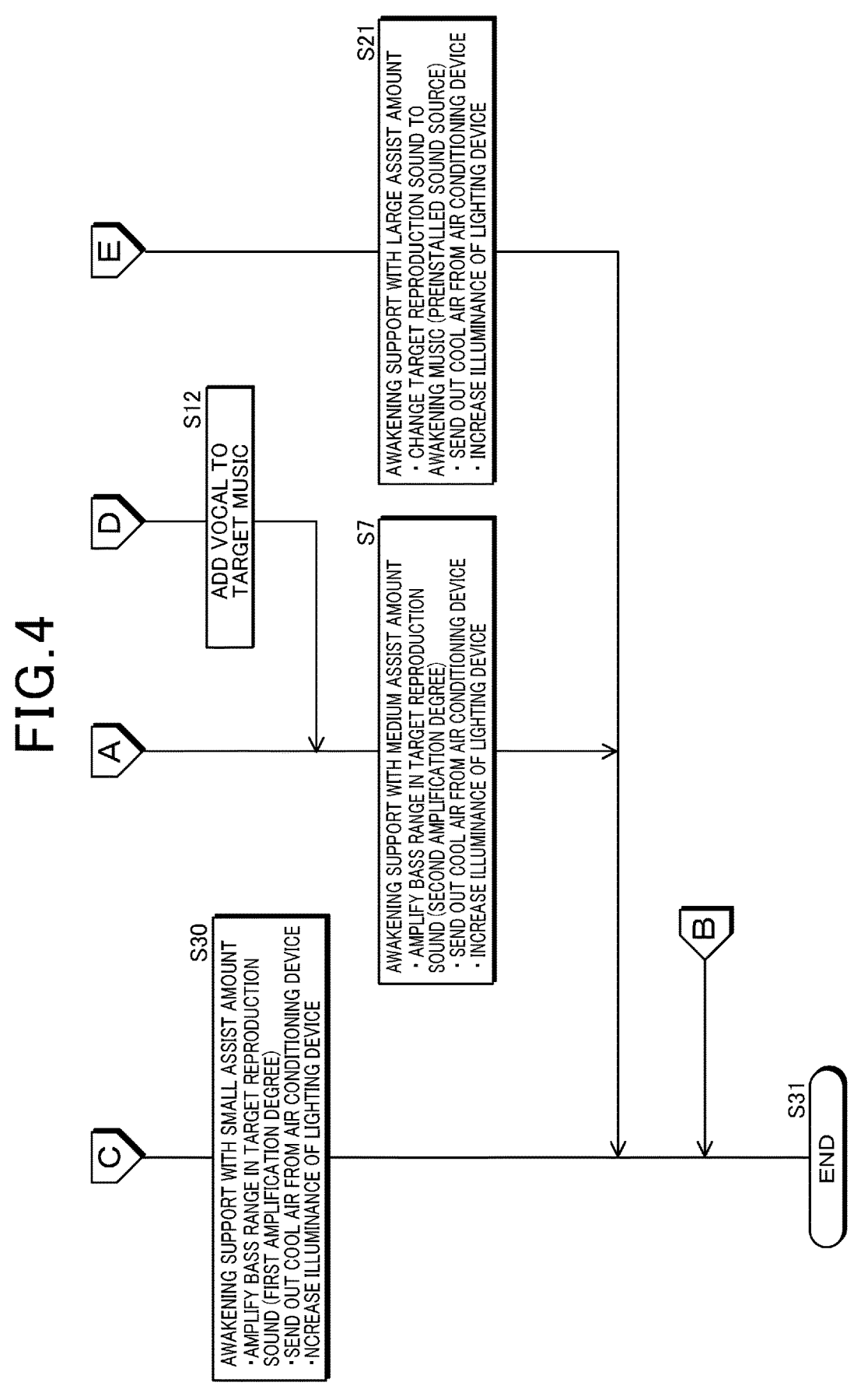
FIG. 4 is a second flowchart of the awakening support processing.

In step S1 of FIG. 3, the first reproduction sound determination unit 12 determines whether music is being output from the audio device 50, and advances the processing to step S2 when the music is being output, while advancing the processing to step S31 of FIG. 4 when no music is being output. In step S2, the first reproduction sound determination unit 12 measures changes in the sound pressure in the prescribed sampling period of the target reproduction sound.

In subsequent step S3, the first reproduction sound determination unit 12 determines whether the first reproduction sound determination condition described above is satisfied. Then, the first reproduction sound determination unit 12 advances the processing to step S10 when the first reproduction sound determination condition is satisfied, and advances the processing to step S4 when the first reproduction sound determination condition is not satisfied.

In step S4, the second reproduction sound determination unit 13 determines whether the second reproduction sound determination condition described above is satisfied for the target reproduction sound based on the analysis result of the changes in the sound pressure performed in step S2. Then, the second reproduction sound determination unit 13 advances the processing to step S5 when the second reproduction sound determination condition is satisfied, and advances the processing to step S7 of FIG. 4 when the second reproduction sound determination condition is not satisfied.

In step S5, the human voice presence determination unit 15 performs a frequency analysis (Fourier transformation, analysis of amplitude component for each frequency, or the like) in the prescribed sampling period of the target reproduction sound. In subsequent step S6, the human voice presence determination unit 15 determines whether the human voice presence determination condition described above is satisfied based on the result of the frequency analysis. Then, the human voice presence determination unit 15 advances the processing to step S20 when the human voice presence determination condition is satisfied, and advances the processing to step S7 of FIG. 4 when the human voice presence determination condition is not satisfied.

In step S20, the singing voice determination unit 16 determines whether the human voice contained in the target reproduction sound is a singing voice. Then, the singing voice determination unit 16 advances the processing to step S12 of FIG. 4 when the human voice contained in the target reproduction sound is a singing voice, and advances the processing to step S21 of FIG. 4 when the human voice contained in the target reproduction sound is not a singing voice.

In step S10, the lyric presence determination unit 11 analyzes presence of lyric components in the target reproduction sound by an AI algorithm or the like. In subsequent step S11, the lyric presence determination unit 11 determines whether lyrics are contained in the target reproduction sound based on the result of analysis regarding the presence of lyric components in the target reproduction sound. Then, the lyric presence determination unit 11 advances the processing to step S30 of FIG. 4 when lyrics are contained in the target reproduction sound, and advances the processing to step S12 of FIG. 4 when lyrics are not contained in the target reproduction sound.

Step S30 of FIG. 4 is the awakening support processing with small assist amount performed by the awakening effect control unit 17, and it corresponds to the case 1 described above. The awakening effect control unit 17 executes at least one of the first processing to the third processing described above. In step S30, the awakening effect control unit 17 sets the amplification degree of the bass part in the first processing to a first amplification degree.

In step S12 of FIG. 4, the vocal adding control unit 14 outputs the data of mixing voice to the audio device 50 to perform the processing for adding the vocal to the target reproduction sound, and advances the processing to step S7. Step S7 is the awakening effect support processing with medium assist amount performed by the awakening effect control unit 17, and it corresponds to the case 2 and the case 5 described above. The awakening effect control unit 17 executes at least one of the first processing to the third processing described above. In step S7, the awakening effect control unit 17 sets the amplification degree of the bass part in the first processing to a second amplification degree (>first amplification degree).

Step S21 of FIG. 4 is the awakening support processing with large assist amount performed by the awakening effect control unit 17, and it corresponds to the case 4 described above. The awakening effect control unit 17 executes at least one of: the processing that outputs the data of the awakening music to the audio device 50, and switches the music output from the audio device 50 from the target reproduction sound to the awakening music; the second processing; and the third processing.

3. Another Embodiment

The embodiment described above includes the first reproduction sound determination unit 12, and it is determined by the lyric presence determination unit 11 whether lyrics are contained in the target reproduction sound, when the first reproduction sound condition is satisfied. However, whether lyrics are contained in the target reproduction sound may be determined by omitting the determination regarding whether the first reproduction sound condition is satisfied.

The embodiment described above includes the vocal adding control unit 14, and the processing for adding vocal to the target reproduction sound is performed when lyrics are not contained in the target reproduction sound. However, the vocal adding control unit 14 may be omitted.

The embodiment described above includes the second reproduction sound determination unit 13 and the human voice presence determination unit 15, and the human voice presence determination unit 15 determines whether the target reproduction sound contains human voice, when the second reproduction sound determination condition is satisfied. Furthermore, when the target reproduction sound contains human voice and it is determined by the singing voice determination unit 16 that the human voice is not a singing voice, the awakening effect control unit 17 executes the output music switching processing for switching the music output from the audio device 50 from the target reproduction sound to the awakening music. As another embodiment, the awakening effect control unit 17 may be configured not to perform the output music switching processing.

While the vehicle 100 is described in the embodiment above as the mobile body of the present disclosure, the mobile body of the present disclosure may simply be any mobile body that is operated by a driver, and may be a flight vehicle, ship, or the like, in addition to a vehicle.

The above embodiment is described by referring to the configuration where the awakening support system 1 is provided in the vehicle 100. However, part of or the entire configuration of the awakening support system 1 may be provided in the vehicle management server 210. In this case, a processor provided in the vehicle management server 210 executes a program saved in a memory provided in the vehicle management server 210 and functions as the lyric presence determination unit 11, the first reproduction sound determination unit 12, the second reproduction sound determination unit 13, the vocal adding control unit 14, the human voice presence determination unit 15, the singing voice determination unit 16, and the awakening effect control unit 17. With this configuration, the data of reproduction sound output from the audio device 50 in the vehicle 100 is transmitted to the vehicle management server 210 from the vehicle 100, and the vehicle management server 210 analyzes the reproduction sound and transmits control data for indicating execution of the first processing to the fourth processing described above to the vehicle 100. Then, an ECU (Electronic Control Unit) or the like provided in the vehicle 100 controls operations of the selector 51, the mixer 52, and the equalizer 53 of the audio device 50 as well as operations of the lighting device 41 and the air conditioning device 42.

Furthermore, part of or the entire configuration of the awakening support system 1 may be provided in the communication terminal 70. In this case, a processor provided in the communication terminal 70 executes a program saved in a memory provided in the communication terminal 70 and functions as the lyric presence determination unit 11, the first reproduction sound determination unit 12, the second reproduction sound determination unit 13, the vocal adding control unit 14, the human voice presence determination unit 15, the singing voice determination unit 16, and the awakening effect control unit 17. Then, the communication terminal 70 performs communication with the audio device 50 to control operations of the selector 51, the mixer 52, and the equalizer 53 of the audio device 50, and performs communication with the ECU or the like of the vehicle 100 to control operations of the lighting device 41 and the air conditioning device 42. Furthermore, in a case where the communication terminal 70 has a music reproduction function and the communication terminal 70 outputs the reproduction sound, the same processing as that of the selector 51, the mixer 52, and the equalizer 53 is performed by the music reproduction function of the communication terminal 70 to perform processing of the target reproduction sound and switching to the awakening music.

While the audio device 50 provided in the vehicle 100 is described as the audio device of the present disclosure in the above embodiment, the audio device of the present disclosure may be the communication terminal 70 that has the music reproduction function. In this case, the awakening support system 1 acquires and analyzes the data of the target reproduction sound being reproduced by the communication terminal 70 by performing wireless or wired communication, and transmits the data of the awakening music, the data of the mixing vocal music, the data of the amplification band setting, and the like to the communication terminal 70 to execute the first processing and the fourth processing described above for the reproduction sound output from the communication terminal 70.

In the above embodiment, the lighting device 41 provided in the interior of the vehicle 100 is described as the lighting device of the present disclosure, and the awakening effect control unit 17 increases the illuminance of the lighting device by the third processing. However, the display 3 may be considered as the lighting device, and the illuminance (brightness) of the display 3 may be increased.

Note that FIG. 1 is a schematic diagram illustrating the configuration of the awakening support system 1 by dividing it according to the main processing contents in order to facilitate understanding of the present invention, and the configuration of the awakening support system 1 may also be divided by other classifications. Furthermore, the processing of each of the structural elements may be executed by a single hardware unit or may be executed by a plurality of hardware units. Moreover, the processing of each of the structural elements shown in FIG. 3 and FIG. 4 may be executed by a single program or may be executed by a plurality of programs.

4. Configuration Supported by the Embodiments

The above-described embodiments are specific examples of the following items.

(Item 1) An awakening support system including: a lyric presence determination unit configured to determine whether lyrics are contained in a target reproduction sound that is being output from an audio device in a mobile body; and an awakening effect control unit configured to, when it is determined by the lyric presence determination unit that lyrics are contained in the target reproduction sound, execute at least one selected from: first bass amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device used in the mobile body.

According to the awakening support system of item 1, it is possible to improve the awakening effect for the driver achieved by outputting the reproduction sound in the mobile body.

(Item 2) The awakening support system according to item 1, including a first reproduction sound determination unit configured to determine whether a first reproduction sound determination condition is satisfied, the first reproduction sound determination condition being that a part where a sound pressure repeatedly increases/decreases by a first prescribed level or more is contained in the target reproduction sound and that a changing rate of a period where the increase/decrease is repeated is equal to or less than a prescribed changing rate, in which the lyric presence determination unit determines whether lyrics are contained in the target reproduction sound, when it is determined by the first reproduction sound determination unit that the first reproduction sound determination condition is satisfied.

According to the awakening support system of item 2, whether lyrics are contained in the target reproduction sound is determined when it is recognized that the target reproduction sound is music because the target reproduction sound contains the part where the sound pressure repeatedly increases/decreases by the first prescribed level or more and the changing rate of the period where the increase/decrease is repeated is equal to or less than the prescribed changing rate. Then, by executing at least one selected from the first bass amplification processing, the cool air sending processing, and the illuminance increasing processing when it is determined that lyrics are contained in the target reproduction sound, the awakening effect for the driver can be improved.

(Item 3) The awakening support system according to item 1 or 2, including a vocal adding control unit configured to execute vocal adding processing that outputs, from the audio device, vocal added music acquired by adding a human vocal part to the target reproduction sound, when it is determined by the lyric presence determination unit that lyrics are not contained in the target reproduction sound, in which, when the vocal added music is being output from the audio device, the awakening effect control unit executes at least one selected from: second bass amplification processing that amplifies and outputs, from the audio device, a prescribed bass part of the vocal added music; the cool air sending processing; and the illuminance increasing processing.

According to the awakening support system of item 3, when it is assumed that the awakening effect for the driver achieved by outputting the target reproduction sound is low because it is determined that no lyrics are contained in the target reproduction sound, the awakening effect for the driver can be improved by executing the vocal adding processing for outputting the vocal added music acquired by adding a human vocal part to the target reproduction sound from the audio device and executing at least one selected from the second bass amplification processing, the cool air sending processing, and the illuminance increasing processing.

(Item 4) The awakening support system according to item 3, in which the awakening effect control unit sets an amplification degree of the bass part in the second bass amplification processing to be larger than an amplification degree of the bass part in the first bass amplification processing.

According to the awakening support system of item 4, it is possible to improve the awakening effect further by outputting the vocal added music acquired by adding a human vocal part to the target reproduction sound.

(Item 5) The awakening support system according to any one of items 1 to 4, including: a first reproduction sound determination unit configured to determine whether a first reproduction sound determination condition is satisfied, the first reproduction sound determination condition being that a part where a sound pressure repeatedly increases/decreases by a first prescribed level or more is contained in the target reproduction sound and that a changing rate of a period where the increase/decrease is repeated is equal to or less than a prescribed changing rate; a second reproduction sound determination unit configured to determine whether a second reproduction sound determination condition is satisfied, the second reproduction sound determination condition being that: it is determined by the first reproduction sound determination unit that the first reproduction sound determination condition is not satisfied; and that a period where an increase/decrease degree of a sound pressure is equal to or less than a second prescribed level repeatedly appears in the target reproduction sound; and a human voice presence determination unit configured to determine whether a human voice presence determination condition is satisfied when it is determined by the second reproduction sound determination unit that the second reproduction sound determination condition is satisfied, the human voice presence determination condition being that a sound in a first prescribed frequency band assumed to be a male voice or a sound in a second prescribed frequency band assumed to be a female voice is contained in the target reproduction sound, in which, when it is determined by the human voice presence determination unit that the human voice presence determination condition is not satisfied, the awakening effect control unit executes at least one selected from: third bass amplification processing that amplifies a prescribed bass part of the target reproduction sound by an amplification degree that is set to be larger than an amplification degree for the bass part in the first bass amplification processing, when the target reproduction sound is being output from the audio device; the cool air sending processing; and the illuminance increasing processing.

According to the awakening support system of item 5, when the target reproduction sound, which is assumed to have a low awakening effect because the target reproduction sound is considered to have some intonation since the first reproduction sound determination condition is not satisfied but considered to have no human voice since the second reproduction sound determination condition is satisfied, is being output, the awakening effect can be improved by executing at least one selected from the third bass amplification processing for amplifying the bass part by the amplification degree set to be larger than the amplification degree of the bass part in the first bass amplification processing, the cool air sending processing, and the illuminance increasing processing.

(Item 6) The awakening support system according to item 5, including a singing voice determination unit configured to determine whether the sound in the first prescribed frequency band assumed to be the male voice or the sound in the second prescribed frequency band assumed to be the female voice is a singing voice of a person, when it is determined by the human voice presence determination unit that the human voice presence determination condition is satisfied, in which, when it is determined by the singing voice determination unit that the sound in the first prescribed frequency band assumed to be the male voice or the sound in the second prescribed frequency band assumed to be the female voice is not a singing voice of a person, the awakening effect control unit executes output reproduction sound switching processing that switches a reproduction sound output from the audio device from the target reproduction sound to prescribed awakening music.

According to the awakening support system of item 6, when it is assumed that the awakening effect is low because the target reproduction sound contains a human voice but the human voice is a narration or the like and not a singing voice, the awakening effect can be improved by outputting the awakening music instead of the target reproduction sound.

(Item 7) An awakening support method executed by a computer, the awakening support method including: a lyric presence determination step of determining whether lyrics are contained in a target reproduction sound that is being output from an audio device in a mobile body; and an awakening effect control step of, when it is determined by the lyric presence determination step that lyrics are contained in the target reproduction sound, amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device provided in the mobile body.

By executing the awakening support method of item 7 by the computer, it is possible to acquire the same effect as that of the awakening support system of item 1.

(Item 8) A non-transitory recording medium storing a program that causes a computer to function as: a lyric presence determination unit configured to determine whether lyrics are contained in a target reproduction sound that is being output from an audio device in a mobile body; and an awakening effect control unit configured to, when it is determined by the lyric presence determination unit that lyrics are contained in the target reproduction sound, execute at least one selected from: first bass amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device provided in the mobile body.

By executing the program of item 8 by the computer, it is possible to implement the same configuration as that of the awakening support system of item 1.

REFERENCE SIGNS LIST

1 Awakening support system
10 Processor
11 Lyric presence determination unit
12 First reproduction sound determination unit
13 Second reproduction sound determination unit
14 Vocal adding control unit
15 Human voice presence determination unit
16 Singing voice determination unit
17 Awakening effect control unit
30 Memory
31 Program
32 Reproduction sound processing data
40 Communication unit
41a to 41d Lighting device
42 Air conditioning device
50 Audio device
51 Selector
52 Mixer
53 Equalizer
54 Amplifier
55a, 55b Speaker
70 Communication terminal
100 Vehicle (mobile body)
200 Communication network
210 Vehicle management server
220 Reproduction sound distribution server
U Driver

What is claimed is:

1. An awakening support system comprising:

a lyric presence determination unit configured to determine whether lyrics are contained in a target reproduction sound that is being output from an audio device in a mobile body; and an awakening effect control unit configured to, when it is determined by the lyric presence determination unit that lyrics are contained in the target reproduction sound, execute at least one selected from: first bass amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device used in the mobile body.

2. The awakening support system according to claim 1, comprising a first reproduction sound determination unit configured to determine whether a first reproduction sound determination condition is satisfied, the first reproduction sound determination condition being that a part where a sound pressure repeatedly increases/decreases by a first prescribed level or more is contained in the target reproduction sound and that a changing rate of a period where the increase/decrease is repeated is equal to or less than a prescribed changing rate, wherein the lyric presence determination unit determines whether lyrics are contained in the target reproduction sound, when it is determined by the first reproduction sound determination unit that the first reproduction sound determination condition is satisfied.

3. The awakening support system according to claim 1, comprising a vocal adding control unit configured to execute vocal adding processing that outputs, from the audio device, vocal added music acquired by adding a human vocal part to the target reproduction sound, when it is determined by the lyric presence determination unit that lyrics are not contained in the target reproduction sound, wherein when the vocal added music is being output from the audio device, the awakening effect control unit executes at least one selected from: second bass amplification processing that amplifies and outputs, from the audio device, a prescribed bass part of the vocal added music; the cool air sending processing; and the illuminance increasing processing.

4. The awakening support system according to claim 3, wherein the awakening effect control unit sets an amplification degree of the bass part in the second bass amplification processing to be larger than an amplification degree of the bass part in the first bass amplification processing.

5. The awakening support system according to claim 1, comprising:

a first reproduction sound determination unit configured to determine whether a first reproduction sound determination condition is satisfied, the first reproduction sound determination condition being that a part where a sound pressure repeatedly increases/decreases by a first prescribed level or more is contained in the target reproduction sound and that a changing rate of a period where the increase/decrease is repeated is equal to or less than a prescribed changing rate;

a second reproduction sound determination unit configured to determine whether a second reproduction sound determination condition is satisfied, the second reproduction sound determination condition being that: it is determined by the first reproduction sound determination unit that the first reproduction sound determination condition is not satisfied; and that a period where an increase/decrease degree of a sound pressure is equal to or less than a second prescribed level repeatedly appears in the target reproduction sound; and a human voice presence determination unit configured to determine whether a human voice presence determination condition is satisfied when it is determined by the second reproduction sound determination unit that the second reproduction sound determination condition is satisfied, the human voice presence determination condition being that a sound in a first prescribed frequency band assumed to be a male voice or a sound in a second prescribed frequency band assumed to be a female voice is contained in the target reproduction sound, wherein when it is determined by the human voice presence determination unit that the human voice presence determination condition is not satisfied, the awakening effect control unit executes at least one selected from: third bass amplification processing that amplifies a prescribed bass part of the target reproduction sound by an amplification degree that is set to be larger than an amplification degree for the bass part in the first bass amplification processing, when the target reproduction sound is being output from the audio device; the cool air sending processing; and the illuminance increasing processing.

6. The awakening support system according to claim 5, comprising a singing voice determination unit configured to determine whether the sound in the first prescribed frequency band assumed to be the male voice or the sound in the second prescribed frequency band assumed to be the female voice is a singing voice of a person, when it is determined by the human voice presence determination unit that the human voice presence determination condition is satisfied, wherein when it is determined by the singing voice determination unit that the sound in the first prescribed frequency band assumed to be the male voice or the sound in the second prescribed frequency band assumed to be the female voice is not a singing voice of a person, the awakening effect control unit executes output reproduction sound switching processing that switches a reproduction sound output from the audio device from the target reproduction sound to prescribed awakening music.

7. An awakening support method executed by a computer, the awakening support method comprising:

a lyric presence determination step of determining whether lyrics are contained in a target reproduction sound that is being output from an audio device in a mobile body; and an awakening effect control step of, when it is determined by the lyric presence determination step that lyrics are contained in the target reproduction sound, amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device provided in the mobile body.

8. A non-transitory recording medium storing a program that causes a computer to function as:

a lyric presence determination unit configured to determine whether lyrics are contained in a target reproduction sound that is being output from an audio device in a mobile body; and an awakening effect control unit configured to, when it is determined by the lyric presence determination unit that lyrics are contained in the target reproduction sound, execute at least one selected from: first bass amplification processing that, when the target reproduction sound is being output from the audio device, amplifies and outputs a prescribed bass part of the target reproduction sound from the audio device; cool air sending processing that sends out cool air from an air conditioning device provided in the mobile body; and illuminance increasing processing that increases illuminance of a lighting device provided in the mobile body.

* * * * *